(12) United States Patent
Romero

(10) Patent No.: US 10,383,230 B1
(45) Date of Patent: Aug. 13, 2019

(54) PRINTED CIRCUIT BOARD WITH SHORT SIDE ELECTRICAL CONNECTION

(71) Applicant: Continental Automotive Systems, Inc., Auburn Hills, MI (US)

(72) Inventor: Henry Romero, Oxford, MI (US)

(73) Assignee: Continental Automotive Systems, Inc., Auburn Hills, MI (US)

( * ) Notice: Subject to any disclaimer, the term of this patent is extended or adjusted under 35 U.S.C. 154(b) by 0 days.

(21) Appl. No.: 16/100,648

(22) Filed: Aug. 10, 2018

(51) Int. Cl.
  *H05K 1/18* (2006.01)
  *H05K 1/11* (2006.01)
  *H01R 12/58* (2011.01)

(52) U.S. Cl.
  CPC .......... *H05K 1/181* (2013.01); *H01R 12/585* (2013.01); *H05K 1/115* (2013.01)

(58) Field of Classification Search
  USPC ................................................ 361/760, 761
  See application file for complete search history.

(56) References Cited

U.S. PATENT DOCUMENTS

2014/0102626 A1* 4/2014 Clayton ................ H05K 3/363
  156/196

* cited by examiner

*Primary Examiner* — Andargie M Aychillhum

(57) ABSTRACT

An electronics device, including: a printed circuit board having a first surface, a second surface opposite the first major surface, and a plurality of side surfaces disposed along a periphery of and between the first and second surfaces, each of the side surfaces being smaller in area than the first and second surfaces; and a plurality of electrical components coupled to the printed circuit board along the first surface thereof, at least some of the plurality of electrical components being electrically coupled together via the printed circuit board. The printed circuit board includes a plated aperture defined in the printed circuit board along a side surface thereof. The printed circuit board provides electrical connectivity to the plated aperture.

22 Claims, 3 Drawing Sheets

PRINTED CIRCUIT BOARD WITH SHORT SIDE ELECTRICAL CONNECTION

FIELD OF INVENTION

The present invention generally relates to a printed circuit board with expanded connectivity, and particularly to a printed circuit board with connectivity along a short side of the board.

BACKGROUND

Electrical components typically include pins for connection to other electrical components or devices. Such connections are often made via a printed circuit board (PCB). Electrical components, both discrete components and integrated circuits, are known to be connected to one or both major sides of the board. Given the greater integration of on-board functionality, there is an increasing need for improving the connectivity between the electrical components and the access thereto.

SUMMARY

Example embodiments overcome shortcomings found in existing PCBs. According to an example embodiment, there is provided an electronics device, including: a printed circuit board having a first surface, a second surface opposite the first surface, and a plurality of side surfaces disposed along a periphery of and between the first and second surfaces, each of the side surfaces being smaller in area than the first and second surfaces; and a plurality of electrical components coupled to the printed circuit board along the first surface thereof. At least some of the plurality of electrical components are electrically coupled together via the printed circuit board. In addition, the printed circuit board includes a plated aperture defined in the printed circuit board along a side surface thereof, and the printed circuit board provides electrical connectivity to the plated aperture.

In an example embodiment, an electrical component is at least partly disposed within the plated aperture. The electrical component at least partly disposed within the plated aperture includes a pin or lead inserted therein, the pin or lead configured for forming one of a press-fit connection and a soldered connection with the plated aperture. The electrical component includes at least one of an electrical connector, an electrical wire, a light emitting diode, and an electrical probe.

The printed circuit board may further include a plated hole defined from the first surface and extending at least partly through the printed circuit board in a direction towards the second surface, and the plated hole is electrically connected to the electrical component that is at least partly disposed within the plated aperture.

The printed circuit board may further include a plated hole defined from the first surface and extending at least partly through the printed circuit board in a direction towards the second surface, and the plated hole is electrically connected to the plated aperture. The plated hole provides an electrical connection between the plated aperture and at least one of the electrical components. The plated hole may be a through-hole which extends from the first surface to the second surface of the printed circuit board.

The printed circuit board may further include a plurality of plated apertures defined in the printed circuit board along one or more side surfaces thereof, the printed circuit board providing electrical connectivity to the plated apertures. The plurality of plated apertures may include a second plated aperture and a third plated aperture, the second and third plated apertures being disposed along the same side surface of the printed circuit board, and the electronics device may further include an electrical component having at least a first lead or pin and a second lead or pin. The first lead or pin and the second lead or pin are at least partly inserted in the second and third plated apertures, respectively.

In another example embodiment, a device is disclosed, including: a printed circuit board having a first surface, a second surface opposite the first surface, and a plurality of side surfaces disposed along a periphery between the first and second surfaces, each of the side surfaces being smaller in area than the first and second surfaces. The printed circuit board includes an aperture defined in the printed circuit board along a side surface thereof, the printed circuit board providing electrical connectivity to the aperture. The aperture may be plated with a metal.

The device may further include one or more electrical components disposed along at least one of the first surface and the second surface, a lead or pin of a first electrical component of the one or more electrical components being electrically connected to the aperture.

The device may include a first electrical component having a lead or pin disposed at least partly within the aperture. In addition, the printed circuit board may include at least one hole defined at least partly through the printed circuit board between the first surface and the second surface, and the at least one hole is electrically connected to the lead or pin of the first electrical component. The at least one hole may be a through-hole which extends from the first surface of the printed circuit board to the second surface thereof. A second electrical component may be included, having a lead or pin which is at least partly disposed in the through-hole and which is electrically connected to the lead or pin of the first electrical component. The device may include a plurality of electrical components having leads or pins which are at least partly inserted in the plurality of apertures. The leads or pins of at least one of the plurality of electrical components are connected to the printed circuit board by one of press-fit attachment and soldered attachment.

BRIEF DESCRIPTION OF THE DRAWINGS

Aspects of the invention will be explained in detail below with reference to an exemplary embodiment in conjunction with the drawings, in which.

DETAILED DESCRIPTION

The following description of the example embodiments are merely exemplary in nature and are in no way intended to limit the invention, its application, or uses. Further, it is understood that the components and features of the example embodiments illustrated are not drawn to scale relative to each other and are illustrated so as to provide clarity and understanding of pertinent features of the example embodiments.

The example embodiments are generally directed to a PCB having a pair of major surfaces and a plurality of side surfaces disposed along the periphery of and between the pair of major surfaces. The PCB further includes one or more apertures, such as one or more plated apertures, defined along one or more of the side surfaces and extending in a direction largely parallel with the major surfaces. The one or more apertures are sized for receiving one or more electrical members and provide electrical connectivity thereto.

Herein, the term "printed circuit board" or "PCB" is described to refer to the board or substrate on which one or more electrical components are disposed. Specifically, the electrical components are not described herein as being or forming part of the PCB. Alternatively, PCB may be considered as including the electrical components connected thereto.

Figure 1:
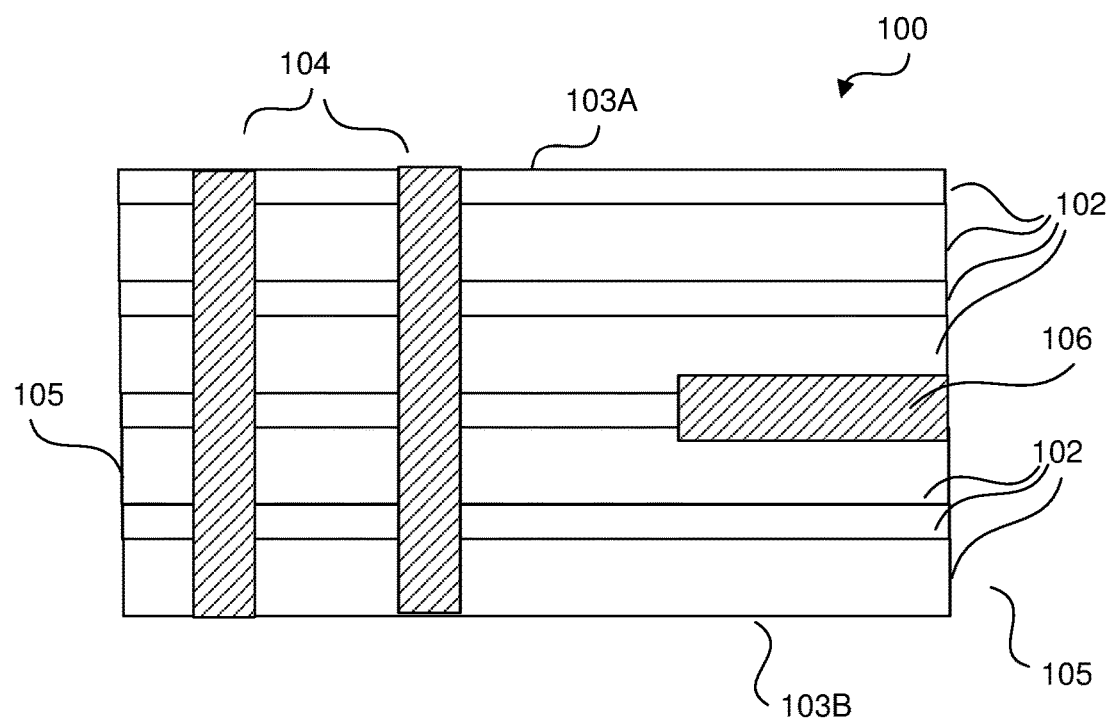
FIG. 1 is a cross-sectional side view of at least a portion of a PCB according to an example embodiment.
Figure 2:
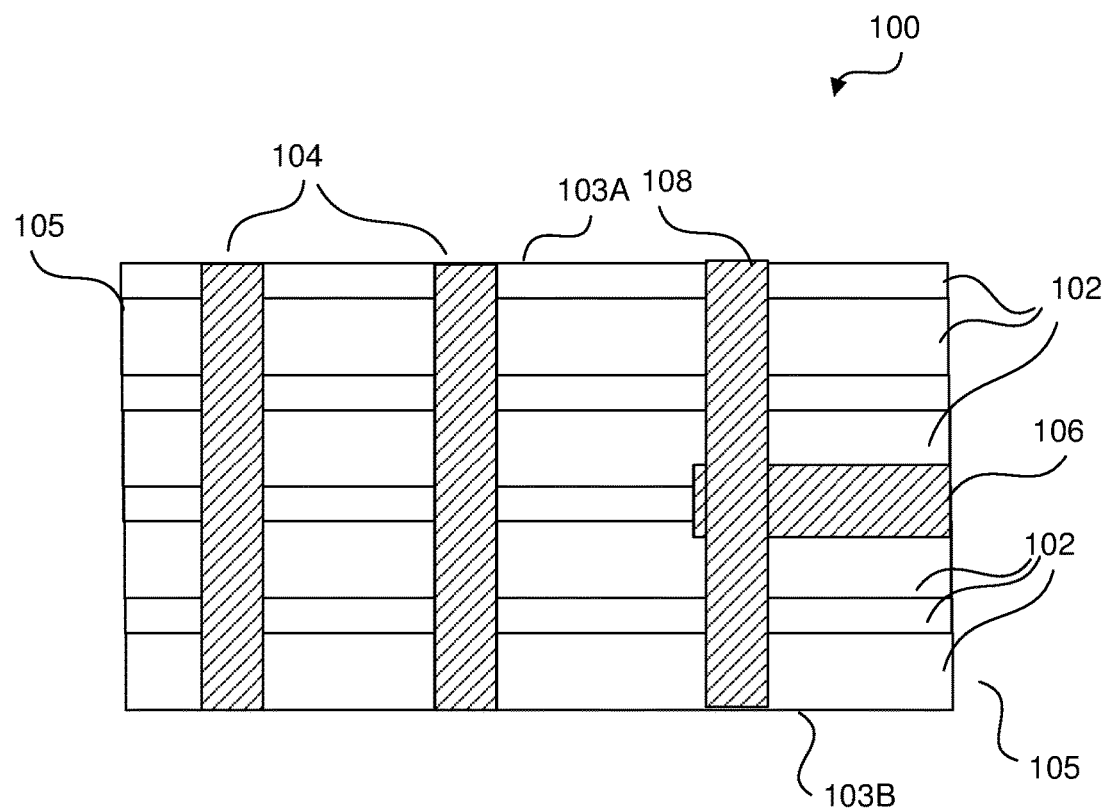
FIG. 2 is a cross-sectional side view of at least a portion of a PCB according to another example embodiment.

Referring to FIGS. 1-2, there is disclosed a PCB 100 according to example embodiments. PCB 100 includes a plurality of laminated layers 102 of electrically conductive and nonconductive material, as is known in the art. The layers 102 of PCB 100 are formed and arranged relative to each other so that electrical connections are made between electrical components coupled to PCB 100 (not shown in FIGS. 1 and 2). Because the formation of laminated layers of material to form a PCB is well known, a detailed discussion of layers 102 will not be provided for reasons of simplicity.

As shown in the drawings, the laminated layers 102 result in PCB 100 including major surfaces 103A and 103B. Surfaces 103A and 103B are sized to allow for a plurality of electrical components 110 to be disposed thereon. Disposed along the periphery of major surfaces 103 and connected between surfaces 103 are a plurality of side surfaces 105. Each side surfaces 105 has a smaller area than major surfaces 103.

Each electrical component 110 forms at least part of an electric circuit or is otherwise connected to the electric circuit. Electrical components 110 may be discrete components (passive or active) or integrated circuits employing between a few transistors to millions thereof. Electrical components 110 may be disposed along either or both of major surfaces 103A and 103B. FIG. 5 illustrates electrical components 110 disposed along surface 103A of PCB 100 and FIG. 6 illustrates electrical components 110 disposed along both surfaces 103A and 103B. Electrical components 110 are electrically connected to each other via metal interconnections defined along and/or within PCB 100, as is widely known in the art. Each electrical component 100 may be attached to PCB 100 using any known technique, such as through-hole (FIG. 3) or surface mount (FIG. 4) technology. With PCB 100 populated with one or more electrical components that are electrically connected to each other, PCB 100 and the electrical components form at least part of an electronics device 10. FIGS. 3-6 depict electronic device 10 according to various example embodiments.

Figure 3:
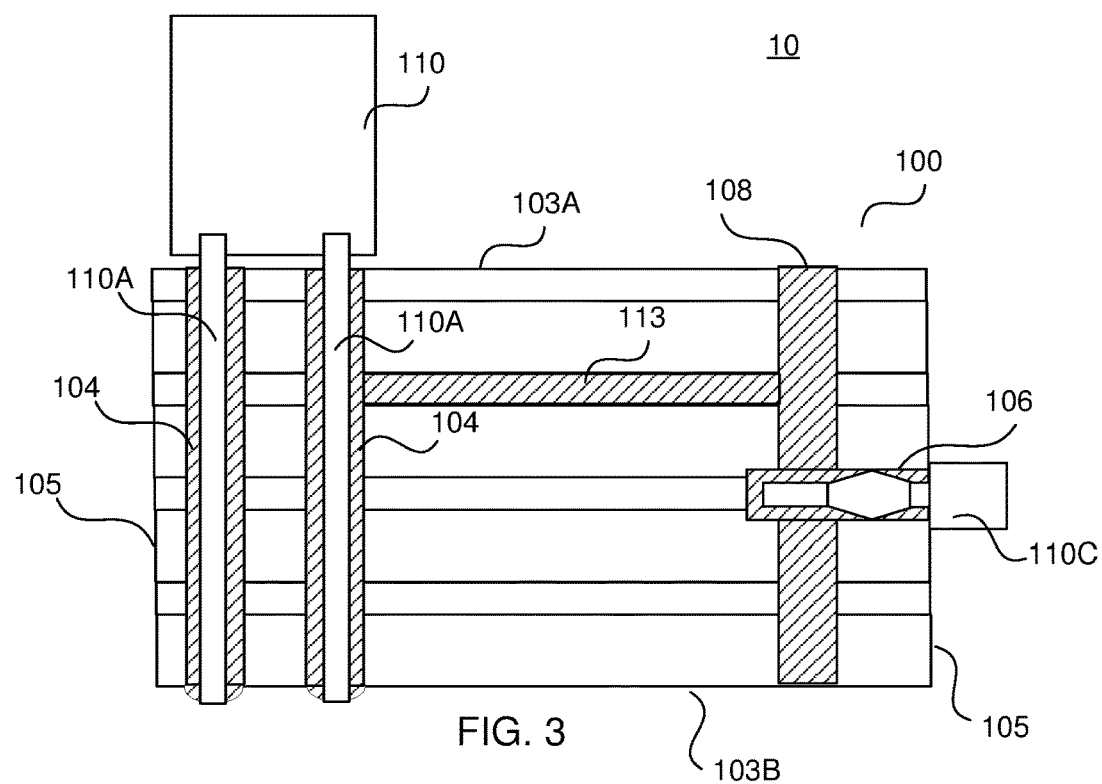
FIG. 3 is a cross-sectional view of an electronics device including a PCB according to another example embodiment.

Referring to FIGS. 1-2, PCB 100 may further include through-holes 104 which extend through PCB 100 from surface 103A to surface 103B. Through-holes 104 are sized and positioned along PCB 100 for receiving through-hole pins 110A of electrical components 110. As shown in FIG. 3, pins 110A of an electrical component 110 extend the entire length of corresponding through-holes 104 so that the distal ends of pins 110A protrude from the corresponding surface 103A or 103B whereupon solder connections are made for securing the pins 110, and thus the electrical component 110 thereof, to PCB 100. In an example embodiment, each through-hole 104 is plated with a metal material to better ensure electrical connectivity with the corresponding pin 104.

Figure 4:
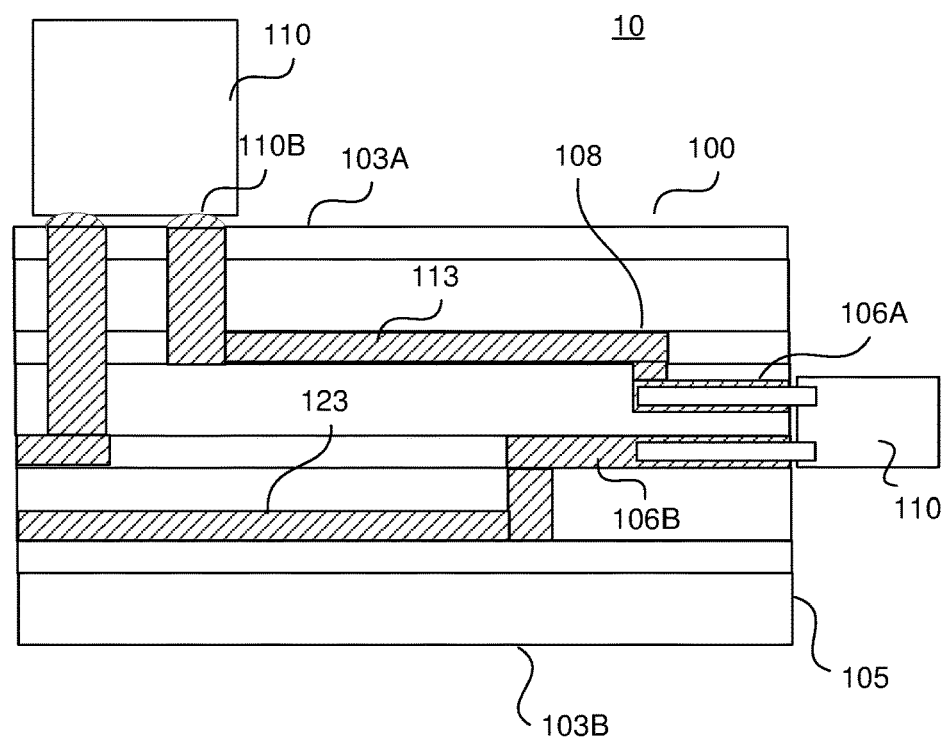
FIG. 4 is a cross-sectional view of an electronics device including a PCB according to yet another example embodiment.
Figure 5:
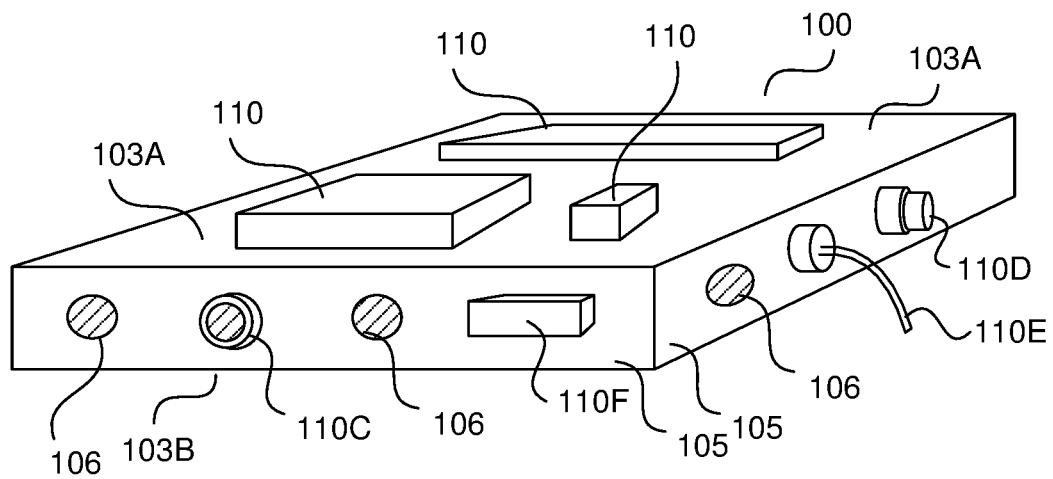
FIG. 5 is a simplified perspective view of an electronics device including a PCB according to another example embodiment.
Figure 6:
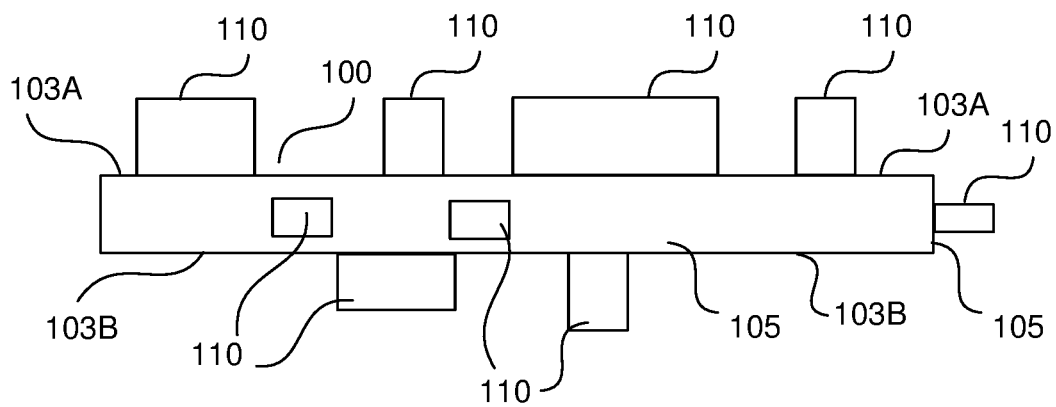
FIG. 6 is a simplified side view of an electronics device including a PCB according to another example embodiment.

In example embodiments illustrated in FIGS. 1-6, PCB 100 further includes at least one aperture 106 which is disposed along and defined in a side surface 105, as shown in FIGS. 1 and 2. Aperture 106 extends in a largely parallel direction with major surfaces 103. Aperture 106 is sized and shaped for at least partly receiving therein an electrical component 110, as discussed below. In this regard, the particular size and shape of aperture 106 may be based upon the electrical component 110 that is desired to be received in aperture 106. In an example embodiment, aperture 106 is plated with a metallic material for ensuring an electrical connection and mechanical attachment to PCB 100. In an example embodiment, PCB 100 includes a plurality of apertures 106 defined along one or more side surfaces 105 of PCB 100. The electrical component 110 at least partly received in aperture 106 may mechanically attach to PCB 100 by press-fit engagement (FIG. 3) or by solder attachment (FIG. 4).

The electrical component 110 disposed at least partly within aperture 106 may be any discrete or integrated component, and in one example embodiment is a light emitting diode (LED) 110D (FIG. 5). In this case, the LED 110D includes one lead or pin which is received in one aperture 106 and a second lead or pin which is received in another aperture 106. The electrical component 110 may also be, for example, a probe for sensing an electrical characteristic such as a voltage or current level at a location or node in PCB 100; an electrical connector 110C (FIGS. 3 and 5), such as a connector for soldered or press-fit attachment to PCB 100 which allows for external electrical connection to a probe, electrical wire, etc.; and an electrical wire member 110E, which itself may include a connector for attaching to and making electrical connection to or within PCB 100. In this way, apertures 106 may allow for electrical components 110 to be electrically and mechanically connected to PCB 100 along all sides 103, 105 thereof.

FIG. 2 illustrates PCB 100 with aperture 106 defined along side surface 105. In addition, a through-hole 108 is defined through PCB 100 from major surface 103A to major surface 103B. Through-hole 108 passes through aperture 106 or otherwise is electrically connected thereto. This through-hole 108 allows for a pin from an electrical component 110 to be received in through-hole 108 and be electrically connected to an electrical component 110 disposed within aperture 106.

FIG. 3 illustrates electronics device 10 having a PCB 100 in which an electrical component 110 is disposed along major surface 103A having pins 110A that are received in through-holes 104. The distal ends of the pins 110A are soldered along major surface 103B. Aperture 106 is defined along a side surface 105 of PCB 100 and an electrical component 110, in this case an electrical connector 110C, is received in aperture 106. A metal trace or segment 113 is defined in or between layers 102 of PCB 100 and runs between a through-hole 104 and aperture 106, thereby providing electrical connectivity between a pin 110A and the electrical component 110 that is at least partly inserted within aperture 106. As shown in FIG. 3, metal trace 113 runs between through-hole 104 (and/or corresponding pin 110A) and through-hole 108, which itself is electrically connected to the electrical component associated with aperture 106. It is understood that metal trace 113 may alternatively run directly between through-hole 104 and aperture 106 for providing electrical connectivity between the electrical component 110 disposed on surface 103A and the electrical component 110 that is at least partly disposed within aperture 106. It is understood that electrical component 110 inserted within aperture 106 may be any electrical component and that electrical connector 110C is illustrated merely as an example.

FIG. 4 illustrates electronics device 10 having PCB 100 in which an electrical component 110 is disposed along major surface 103A having surface mount electrical connections. In this case, electrical component 110 includes a ball grid array which is electrically connected along major surface 103A. A pair of apertures 106A, 106B is defined along a side surface 105 of PCB 100, and an electrical component 110 having a pair of leads or pins are received in apertures 106A and 106B. In this case, the leads or pins of electrical component 110 are electrically and mechanically connected to apertures 106 via solder attachments. It is understood, however, that electrical component 110 may have leads or pins which are press-fit within apertures 106A and 106B. The electrical component 110 connected to apertures 106 may be any of a number of 2-pin or 2-lead electrical components, such as LED 110D. A metal trace 113 is defined in or between layers 102 of PCB 100 and runs between one aperture 106A and a solder ball 110B of the ball grid array of electrical component 110, thereby providing electrical connectivity between the solder ball and the lead or pin of the electrical component 110 associated with aperture 106A. As illustrated, a second metal trace 123 is electrically connected to the second aperture 106B and runs within PCB 100 for electrical connection elsewhere within electronics device 10.

FIG. 5 illustrates electronics device 10 having a PCB 100 in which a plurality of electrical components 110 are disposed along major surface 103A and a plurality of apertures 106 are defined along at least two side surfaces 105. As shown, electrical components 110, including electrical connector 110C, LED 110D, wire member 110E with electrical connector, and integrated circuit 110F, are disposed or inserted in some of the apertures 106.

FIG. 6 illustrates PCB 100 according to another example embodiment in which a plurality of electrical components 110 are disposed along major surfaces 103A and 103B as well as side surfaces 105.

The electronics devices, and particularly the PCBs, described above allow for the placement of electrical components along the side surfaces of the PCB. This results in greater integration of circuitry and/or electrical circuits on the PCB and a reduction in size of the electronics device.

The example embodiments have been described herein in an illustrative manner, and it is to be understood that the terminology which has been used is intended to be in the nature of words of description rather than of limitation. Obviously, many modifications and variations of the invention are possible in light of the above teachings. The description above is merely exemplary in nature and, thus, variations may be made thereto without departing from the spirit and scope of the invention as defined in the appended claims.

What is claimed is:
1. An electronics device, comprising:
a printed circuit board having a first surface, a second surface opposite the first surface, and a plurality of side surfaces disposed along a periphery of and between the first and second surfaces, each of the side surfaces being smaller in area than the first and second surfaces; and
a plurality of electrical components coupled to the printed circuit board along the first surface thereof, at least some of the plurality of electrical components being electrically coupled together via the printed circuit board,
wherein the printed circuit board includes a plated aperture defined in the printed circuit board along a side surface thereof, the plated aperture defined from a first side surface of the plurality of side surfaces and extends at least towards a side surface of the plurality of side surfaces that is opposite the first side surface, the printed circuit board providing electrical connectivity to the plated aperture.

2. The electronics device of claim 1, further comprising an electrical component at least partly disposed within the plated aperture.

3. The electronics device of claim 2, wherein the electrical component at least partly disposed within the plated aperture includes a pin or lead inserted therein, the pin or lead configured for forming one of a press-fit connection and a soldered connection with the plated aperture.

4. The electronics device of claim 2, wherein the electrical component comprises one of an electrical connector, an electrical wire, a light emitting diode, and an electrical probe.

5. The electronics device of 2, wherein the printed circuit board further comprises a plated hole defined from the first surface and extending at least partly through the printed circuit board in a direction towards the second surface, the plated hole being electrically connected to the electrical component that is at least partly disposed within the plated aperture.

6. The electronics device of claim 1, wherein the printed circuit board further comprises a plated hole defined from the first surface and extending at least partly through the printed circuit board in a direction towards the second surface, the plated hole being electrically connected to the plated aperture.

7. The electronics device of claim 6, wherein the plated hole at least partly provides an electrical connection between the plated aperture and at least one of the electrical components disposed along the first surface.

8. The electronics device of claim 6, wherein the plated hole comprises a through-hole which extends from the first surface to the second surface.

9. The electronics device of claim 1, wherein the printed circuit board includes plurality of plated apertures defined in the printed circuit board along one or more side surfaces thereof, each of the plurality of plated apertures defined from a side surface of the one or more side surfaces and extends at least towards an opposed side surface, the printed circuit board providing electrical connectivity to the plated apertures.

10. The electronics device of claim 9, wherein the plurality of plated apertures comprises a second plated aperture and a third plated aperture, the second and third plated apertures being disposed along the same side surface of the printed circuit board, and the electronics device further comprises an electrical component having at least a first lead or pin and a second lead or pin, the first lead or pin and the second lead or pin being at least partly inserted in the second and third plated apertures, respectively.

11. The electronics device of claim 1, wherein the printed circuit board has a rectangular prism shape in which the first and second surfaces are major surfaces of the printed circuit board and the each of the plurality of side surfaces is perpendicular to the first and second surfaces.

12. A device, comprising:
a printed circuit board having a first surface, a second surface opposite the first surface, and a plurality of side surfaces disposed along a periphery between the first and second surfaces, each of the side surfaces being smaller in area than the first and second surfaces, wherein the printed circuit board includes an aperture defined in the printed circuit board along a side surface thereof, the aperture being defined from a first side surface of the plurality of side surfaces, and extends at least towards a side surface of the plurality of side surfaces that is opposite the first side surface, the printed circuit board providing electrical connectivity to the aperture.

13. The device of claim 12, wherein the aperture is plated with a metal.

14. The device of claim 12, further comprising one or more electrical components disposed along at least one of the first surface and the second surface, a lead or pin of a first electrical component of the one or more electrical components being electrically connected to the aperture.

15. The device of claim 12, further comprising a first electrical component having a lead or pin disposed at least partly within the aperture.

16. The device of claim 15, wherein the printed circuit board includes at least one hole defined at least partly through the printed circuit board between the first surface and the second surface, and the at least one hole is electrically connected to the lead or pin of the first electrical component.

17. The device of claim 16, wherein the at least one hole is a through-hole which extends from the first surface of the printed circuit board to the second surface thereof.

18. The device of claim 16, further comprising a second electrical component having a lead or pin which is at least partly disposed in the at least one hole and which is electrically connected to the lead or pin of the first electrical component.

19. The device of claim 12, further comprising a plurality of apertures defined along one or more side surfaces of the printed circuit board, each of the plurality of apertures defined from a side surface of the one or more side surfaces and extends at least towards an opposed side surface, the plurality of apertures being plated apertures and the printed circuit board providing electrical connectivity to the plated apertures.

20. The device of claim 19, further comprising a plurality of electrical components having leads or pins which are at least partly inserted in the plurality of apertures.

21. The device of claim 19, wherein the leads or pins of at least one of the plurality of electrical components are connected to the printed circuit board by one of press-fit attachment and soldered attachment.

22. The device of claim 12, wherein the first and second surfaces are major surfaces of the printed circuit board and the each of the plurality of side surfaces is perpendicular to the first and second surfaces.

* * * * *